United States Patent [19]
Van Der Putten

[11] Patent Number: 5,367,479
[45] Date of Patent: Nov. 22, 1994

[54] DIVIDER DEVICE TO DIVIDE A FIRST POLYNOMIAL BY A SECOND ONE

[75] Inventor: Frank O. Van Der Putten, Oude Wichelsesteenweg, Belgium

[73] Assignee: Alcatel N.V., Amsterdam, Netherlands

[21] Appl. No.: 91,304

[22] Filed: Jul. 13, 1993

[30] Foreign Application Priority Data

Jul. 14, 1992 [EP] European Pat. Off. ......... 92202147.2

[51] Int. Cl.$^5$ .............................................. G06F 7/52
[52] U.S. Cl. .................................. 364/761; 364/746.1
[58] Field of Search ................. 364/764, 761, 746.1

[56] References Cited

U.S. PATENT DOCUMENTS

| | | |
|---|---|---|
| 3,678,469 | 7/1972 | Freeman et al. |
| 4,105,999 | 8/1978 | Nakamura . |
| 4,574,361 | 3/1986 | Inagawa et al. ................. 364/746.1 |
| 4,800,515 | 1/1989 | Hori et al. ........................ 364/746.1 |
| 5,130,991 | 7/1992 | Takano . |
| 5,136,592 | 8/1992 | Weng .............................. 364/746.1 |
| 5,185,711 | 2/1993 | Hattori ............................ 364/746.1 |

FOREIGN PATENT DOCUMENTS

| | | |
|---|---|---|
| 0092960 | 11/1983 | European Pat. Off. . |
| 0230730 | 8/1987 | European Pat. Off. . |
| 0444661 | 9/1991 | European Pat. Off. . |
| 0477553 | 4/1992 | European Pat. Off. . |
| 0492812 | 7/1992 | European Pat. Off. . |
| 3841370 | 6/1989 | Germany . |

OTHER PUBLICATIONS

*Digital Communcations-Fundamentals and Applications*, B. Sklar, Prentice-Hall Editions 1988, "Channel Coding: Part 1", Chapter 5, Paragraph 5.6.4, pp. 292-294.
An 92-032940 C05, Derwent Publications Ltd., London, GB, Week 9205 and AU-D-7 704 291, Dec. 5, 1991 (Alcatel N.V.).
Patent Abstracts of Japan, vol. 16, No. 188 (E-1198) May 7, 1992 and JP-A-40 23 646 Jan. 28, 1992 (NIC Corp.).
Patent Abstracts of Japan, vol. 15, No. 284 (E-1091) Jul. 18, 1991 and JP-A-30 98 346 Apr. 23, 1991 (NTT Corp.).

*Primary Examiner*—Tan V. Mai
*Attorney, Agent, or Firm*—Ware, Fressola, Van Der Sluys & Adolphson

[57] ABSTRACT

The divider device is used in a digital communication network to detect bit errors by dividing a first polynomial corresponding to a first bit sequence by a second polynomial, called a generator polynomial, represented by a second bit sequence. The device performs, by means of an iterative process, an n-bit parallel division of the first bit sequence by the second one, i.e. n bits at a time. It includes an addition circuit A to n first inputs 17/IO of which the n bits are applied and a divider circuit D to n inputs of which n respective outputs of A are coupled back via a register circuit R and n outputs of which are coupled to n second inputs of A. The remainder of the division is generated at n outputs of R.

12 Claims, 1 Drawing Sheet

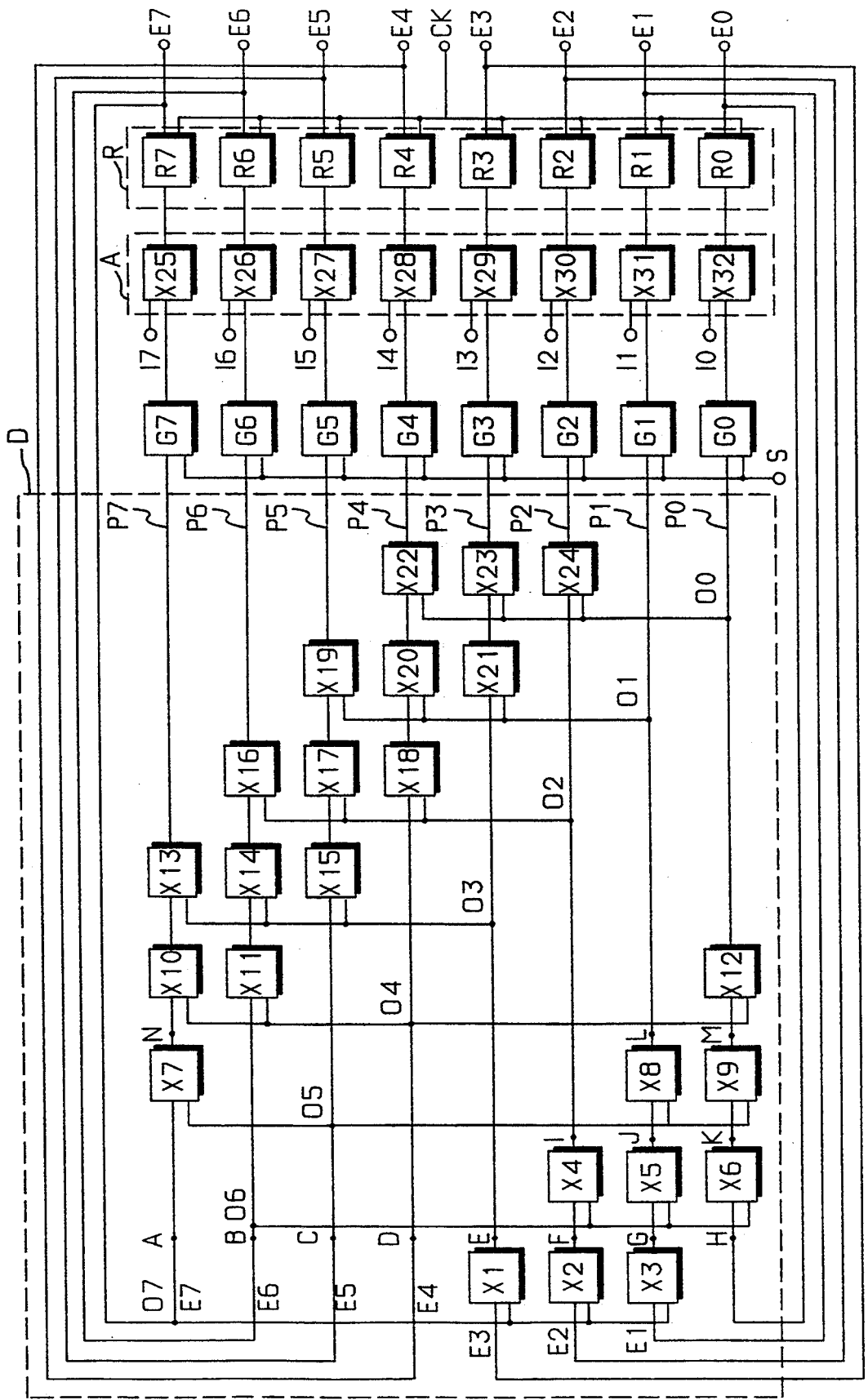

DIVIDER DEVICE TO DIVIDE A FIRST POLYNOMIAL BY A SECOND ONE

Cross-Reference to Related Application

This application discloses subject matter which is disclosed and may be claimed in copending application Ser. No. 08/090,661, file Jul. 13, 1993, entitled "Error Detection and Correction Device", of Assignee hereof, filed on even date herewith. Technical Field The present invention relates to a divider device to divide a first polynomial constituted by a first sequence of bits, by a second polynomial constituted by a second sequence of bits and of degree d not exceeding the degree of said first polynomial.

BACKGROUND OF THE INVENTION

Such a device is well known in the art, for instance from the book "Digital Communications - Fundamentals and Applications" by Bernard Sklar, Prentice-Hall International Editions 1988, paragraph 5.6.4.

The device described therein performs the polynomial division on a bit by bit basis making use of clocked shift registers, thus implying that the rate of a clock controlling these shift registers has to be equal to the arrival rate of the bits of the first sequence at an input of the device. In current communication systems where such a device is used to detect bit errors by using for instance a cyclic redundancy check algorithm wherein such a division is performed, this rate can be relatively high, e.g. 600 Mbit/s, for an ATM network.

DISCLOSURE OF THE INVENTION

An object of the invention is to provide a divider device of the above type, but which is able to operate at a clock rate substantially lower than the bitrate of said first sequence of bits.

This object is achieved due to the fact that it includes a bit addition means with n first inputs, n second inputs and n outputs, and able to add n successive bits of said first sequence applied to respective ones of said first inputs to n bits applied to respective ones of said second inputs, n not being exceeded by d;

a divider circuit having n inputs and n outputs coupled to respective ones of said second inputs of said addition means; and clock controlled register means having n inputs to which respective ones of said outputs of said addition means are connected and having n outputs coupled back to respective ones of said inputs of said divider circuit; said divider device performing said division during successive corresponding steps of an iterative process involving successive sets of n bits of said first sequence, each of said steps consisting in functionally dividing in said divider circuit n bits provided at said n input thereof as a result of a preceding iterative step, by said second sequence of bits until a remainder of a degree equal to that of a following subset of n bits of said first sequence is obtained, said remainder being provided at said n outputs of said divider circuit and the remainder of said iterative process being provided at said n outputs of said register means.

In this way, the divider device becomes a parallel divider performing the division by means of an iterative process and handling n bits at a time in each step of the process. Consequently a clock used in the latter device to control the register means may operate at a clock rate which is n times lower than the arrival rate of the bits of the first sequence.

A characteristic feature of the divider device according to the invention is that said divider circuit includes a plurality of sets of gating means connected between said n inputs and said n outputs of said divider circuit, each of said sets performing one step of said functional division.

The divider circuit performs the above n-bit parallel functional division of n bits of the first polynomial by the second polynomial in steps, as in a theoretical division namely by in each step (module 2) adding the coefficients of the second polynomial to subsets of $d+1$ bits of the first polynomial said subsets being in each step shifted over one bit of the n bits with respect to the previous step and this until a remainder is obtained which has a degree corresponding to that of a next set of n bits. The modulo 2 addition is performed using gating means, more specifically exclusive-OR (XOR) circuits.

As a result another characteristic of the divider circuit according to the invention is that each gating means of each of said sets is part of a cascade connection of a plurality of said gating means via which one of said n inputs of said divider circuit is coupled to a respective one of said n outputs of said divider circuit and that when the last bit of said second sequence has a one value and n equals d, each of said n inputs of said divider circuit, except a first one is connected to a first input of a gating means of a first one of said sets, when a corresponding coefficient of said second polynomial equals one, a second input of said gating means being connected to said first input terminal and subsequent ones of said sets being connected in a similar way to said respective inputs but shifted in a circular way over one input with respect to a previous set or being connected to an output of one of said gating means of a previous set when said one is coupled to said input.

The consecutive shifts of the coefficients of the second polynomial over the bits of a set in this way correspond with a shift of the connection of a set of gating means over one input of the divider circuit with respect to a previous set, this shift being performed in a circular way, i.e. a shift after the nth input corresponds to the use of the first one.

Still another characteristic of the invention is that when the last bit of said second sequence of bits has a one value and n equals d, said divider circuit includes m gating means, m not exceeding n, each of which has an output coupled to a respective one of said outputs of said divider device via said addition means and said register means and each of which has a plurality of inputs each coupled to a predetermined one of said outputs of said divider device. This is a second embodiment of the divider circuit, derived from the above described first embodiment by combining, in the latter embodiment, for each output of the divider circuit the gating means coupled to that output.

The above mentioned and other objects and features of the invention will become more apparent and the invention itself will be best understood by referring to the following description of an embodiment taken in conjunction with the accompanying drawing which represents an embodiment of a divider device according to the invention.

Brief Description of the Drawing

The sole FIG. shows a divider device, according to the present invention.

Best Mode for Carrying Out the Invention

The divider device of the figure forms part of transmitters and of receivers of a switching system (not shown) wherein data packets are transmitted from these transmitters to the receivers (both not shown) through a switching network (also not shown).

The divider device of the figure may form part of an "Error Detection and Correction Device", such as disclosed in the copending patent application cross-referenced above.

Each of these data packets comprises a data part of 32 bytes and a header part of 4 bytes. One byte of the data part is constituted by a data error code which is generated in a transmitter and checked in a receiver to detect in the data part possible bit errors caused by transmission over the switching network. The data error code byte is calculated in the transmitter according to a so-called Cyclic Redundancy Check (CRC) algorithm, i.e. as the remainder of the modulo 2 division of the product ($x^{}8$ multiplied by the content of the data part excluding the error code byte) by a so-called generator polynomial, in this case $x^{}8+x^{}4+x^{}3+X^{**}2+1$. To this end use is made of the divider circuit of the figure. In the receiver the data error code byte is recalculated and the result thereof is compared with the received error code byte, or the error code is included in the above calculation and the result is compared with zero. The bitwise modulo 2 addition of the received error code, or a zero byte, and the calculated error code, (not including or including the received error code respectively) is indicative of the location of a possible single bit error in the transmitted data part. Once the location of the bit error is known, the erroneous bit value can be adapted and the error is thereby corrected.

It has to be noted that in the application of the above mentioned algorithm on the 32 byte data part, using a generator polynomial of 8 th degree, the first bit of each packet is not considered and is transmitted as an idle bit. A polynomial of the 8 th degree makes it indeed possible to detect single bit errors in a bitstream of maximum 255 bits whilst the considered data parts include 256 bits.

The above technique of bit error detection and correction is well known and is for instance described in the earlier mentioned book and more specifically in section 5.6.6 thereof.

The device of the figure performs the division of a sequence of data bits—called I7 to I0—applied to its like named inputs by the coefficients of the polynomial $X^{}8+X^{}4+X^{}3+X^{}2+1$ 8 bits at a time, i.e. in subsequences of 8 bits as explained later. It includes 32 exclusive-Or (X-OR) gates X1 to X32, 8 AND gates G7 to G0 and a register device comprising 8 register circuits, R7 to R0, having individual data inputs, individual data outputs E7 to E0 and a common clock input CK to which a like named clock signal is applied. The eight input terminals I7 to I0 are connected to respective first inputs of the X-OR gates X25 to X32 which together consititute an addition circuit A. Outputs of the latter gates are connected to respective inputs of the register circuits R7 to R0 respectively.

Output E7 of R7 is connected to a first input of X7 which is connected in cascade with X10 and X13 via first inputs thereof, an output of X13 being coupled via G7 to a second input of X25. In a same way output E6 of R6 is coupled to X26 over X11, X14, X16 and G6; E5 of R5 is coupled to X27 via X15, X17, X19 and G5; E4 of R4 to X28 via X18, X20, X22 and G4; E3 of R3 to X29 via X1, X21, X23 and G3; E2 of R2 is coupled to X30 via X2, X4, X24 and G2; E1 of R1 is coupled to X31 via X3, X5, X8 and G1, and E0 of R0 is coupled to X32 via X6, X9, X12 and G0. Second inputs of G7 to G0 are connected to a common control terminal S, whilst second inputs of X1 to X3, X4 to X6, X7 to X9, X10 to X12, X13 to X15, X16 to X18, X19 to X21, X22 to X24 are connected to the mentioned first inputs of X7, X11, X15, X18, X21, X24 respectively.

Gates X1 to X24 constitute a division circuit D, inputs of which correspond to E7 to E0 and first outputs of which correspond to the outputs of X13, X16, X19, X22, X23, X24, X8 and X12 and are called P7 to P0 respectively. D performs a functional division by the mentioned generator polynomial of the sequence of bits applied to I7 to I0 in subsequences of 8. As will be explained later, this division is a parallel division, i.e. it is performed 8 bits at a time.

Following is now a description of the operation of the division device represented in the figure.

To start the division of the first 8 bits I7 to I0 of a bit sequence constituting a first polynomial and applied to I7 to I0 at a first clock pulse of CK, a zero bit is applied to the terminal S, in order to disable the gates G7 to G0 and to thus apply a zero signal to the second inputs of X25 to X32 respectively, so that E7 to E0 equal I7 to I0 at the latter first clock pulse of CK. CK has a clock rate equal to ⅛th of the arrival bit rate of the bits of the bit sequence.

D functionally divides the 8 bits provided at E7 to E0, i.e. I7 to I0 at the first clock pulse of CK, until a remainder is obtained which has a degree corresponding to the degree of the next 8 bits of the received sequence and applied at I7 to I0, the division being a modulo 2 division. To obtain a remainder of the required degree 8 steps are required.

The first three steps of such a functional division theoretically realized is represented hereafter:

```
E7 E6 E5 E4 E3 E2 E1 E0 0         /1 0 0 0 1 1 1 0 1
E7  0  0  0 E7 E7 E7  0 E7         E7 E6 E5
─────────────────────────
 0 E6 E5 E4 x1 x2 x3 E0 E7 0
   E6  0  0  0 E6 E6 E6  0 E6
   ─────────────────────────
    0 E5 E4 x1 x4 x5 x6 E7 E6 0
      E5  0  0  0 E5 E5 E5  0 E5
      ─────────────────────────
       0 E4 x1 x4 x8 x9 x7 E6 E5
```

In the first step of the functional division the quotient bit equals E7. Indeed, if E7 equals 0 respectively 1 the coefficients of the second polynomial have to be multiplied by 0 respectively 1 and have to be added modulo 2 to the 8 bits E7 to E0 to provide a first intermediate remainder. E7 added modulo 2 to E7 equals 0 which means that the first bit of the intermediate remainder has not to be taken into account in the following steps of that division. Addition of E3 to E7 is performed in the figure by X1 and the result thereof is called x1. In the same way E2 and E1 are added to E7 by X2 and X3 respectively and the result is called x2 and x3. E6, E5, E4 and E0 are added to 0 and keep their value, therefore no X-OR's are used in a first step on the wires coupled to the inputs E6, E5, E4 as shown in the figure. Since the second or generator polynomial is of degree 8, it has 9 coefficients. The constant coefficient 1 multiplied with E7 is therefore theoretically added to 0 and the result thereof equals E7, which is realized in a first step on the wire coupled to E7. The intermediate remainder of a first step of the division is thus obtained in the figure at the points B to H and A respectively. In a next step and in a similar way, the coefficients of the generator polynomial are multiplied by E6 and added to the intermediate remainder of the first step, thus realizing the intermediate remainder of the second step, i.e. 0 E5 E4 x1 x4, being x2+E6, x5, being x3+E6, x6, being E0+E6, E7, E6, 0. These bits are obtained at the points C, D, E, I, J, K, A, B respectively of the figure.

In a same way the intermediate remainder of the third step is realized and obtained at the points D, E, I, L, M, N, B, C respectively. After 8 such steps, which correspond to the division of the 8 bits applied at E7 to E0 concatenated with 8 zeros, a remainder having the same degree as the next 8 bits applied at I7 to I0 is obtained at P7 to P0. The consecutive steps of the division are thus realized by the X-OR sets X1 to X3; X4 to X6; X8, X9, X7; X12, X10, X11; X13 to X15; X16 to X18; X19 to X21 and X22 to X24.

It has to be noted that the shift of the generator polynomial coefficients over the 8 input bits concatenated with 8 zero bits as in the theoretical calculation corresponds, in the considered embodiment, with consecutive topological shifts of the 3 X-OR circuits comprised in a set of X-OR circuits over one input terminal of D, as can be seen in the figure.

The remainder obtained at P9 to P0 is the remainder of the division of 16 bits of the first sequence, assuming that the second 8 bits of those 16 are zero bits. As this is not necessarily the case, the 8 following bits of the first sequence applied at I7 to I0 have, at the next clock pulse, to be added to the obtained remainder bits by X25 to X32 and the result thereof is provided at E7 to E0. D then performs the functional division of the bits of this result (again concatenated with 8 zero bits), by the coefficients of the generator polynomial and the obtained remainder bits are again added to the following 8 bits, and so on, until all bits of the sequence have been processed. The bits generated at E7/E0 at the last clock pulse, i.e. when the last 8 bit are applied at I7 to I0 constitute the bits of the remainder of the division of the first sequence of bits by the coefficients of the generator polynomial. These bits may indeed not be devided again since they constitute a polynomial of degree 7 which is lower than the degree of the generator polynomial and they consequently constitute the remainder of the division.

It has to be noted that the subsequent bytes of the quotient of this division which are not used in the detection algorithm are available at O7 to O0, one byte at each clock pulse excluding the last one.

The device represented in the figure can be simplified by combining for each input of D, i.e. E7 to E0, the X-OR circuits coupled therewith.

If we take for example E2, the signal applied at E2 can be written as I2+O0+E6+E7+E2=I2+E4+E5+E6+E0+E6+E7+E2=I2+E4+E5+E0+E7+E2=I2+E0+E2+E4+E5+E7. As a consequence X2, X4 and X24 can be replaced by a 5 input X-OR the inputs of which are connected with E0, E2, E4, E5 and E7 respectively.

In a similar way the other input signals of D can be written in function of each other and of E2 and I0 to I7, and the X-OR circuits generating those input signals can be replaced accordingly.

It has to be noted that the above description of the two embodiments is only applicable for division by the mentioned generator polynomial and for an 8 bit parallel division. In case of other generator polynomials and n bit parallel divisions where n may not be exceeded by the degree of the generator polynomial the structure of the subdivider circuit has to be adapted accordingly. Based on the above description of how the divider circuit is derived from the theoretical functional division this adaption is however obvious for a person skilled in the art.

While the principles of the invention have been described above in connection with specific apparatus, it is to be clearly understood that this description is made only by way of example and not as a limitation on the scope of the invention.

I claim:

1. Divider device to divide a first polynomial constituted by a first sequence of bits and having a degree equal to a value of a highest exponent of the first polynomial, by a second polynomial constituted by a second sequence of bits and of degree d equal to a value of a highest exponent of the second polynomial, d not exceeding the degree of said first polynomial, comprising:
    a bit addition means (A) with n first inputs (I7/I0), n second inputs and n outputs, and able to add n successive bits of said first sequence applied to respective ones of said first inputs to n bits applied to respective ones of said second inputs, d being less than or equal to n;
    a divider circuit (D) having n inputs (E7/E0) and n outputs (P7/P0) coupled to respective ones of said second inputs of said addition means (A); and
    clock controlled register means (R) having n inputs to which respective ones of said outputs of said addition means (A) are connected and having n outputs (E7/E0) coupled back to respective ones of said inputs of said divider circuit (D); said divider device performing said division during successive corresponding steps of an iterative process involving successive sets of n bits of said first sequence, each of said steps comprising the steps of functionally dividing in said divider circuit n bits provided at said n input thereof as a result of a preceding iterative step, by said second sequence of bits until a remainder of a degree equal to that of a following subset of n bits of said first sequence is obtained, said remainder being provided at said n outputs (P7/P0) of said divider circuit (D) and the remainder of said iterative process being provided at said n outputs of said register means (R).

2. Divider device according to claim 1, wherein said divider circuit (D) includes a plurality of sets (X1/X3; X4/X6; X7/X9; X10/X12; X13/X15; X16/X18; X19/X21; X22/X24) of gating means (X1/X24) connected between said n inputs (E7/E0) and said n outputs (P7/P0) of said divider circuit, each of said sets performing one step of said steps of functionally dividing.

3. Divider device according to claim 2, wherein each gating means (X1/X24) of each of said sets is part of a cascade connection of a plurality of said gating means via which one of said n inputs of said divider circuit (D) is coupled to a respective one of said n outputs of said divider circuit.

4. Divider device according to claim 3, wherein when the last bit of said second sequence has a one value and n equals d, each of said n inputs of said divider circuit, except a first one is connected to a first input of a gating means of a first one of said sets, when a corresponding coefficient of said second polynomial equals one, a second input of said gating means being connected to said first input terminal and subsequent ones of said sets being connected in a similar way to said respective inputs but shifted in a circular way over one input with respect to a previous set or being connected to an output of one of said gating means of a previous set when said one is coupled to said input.

5. Divider device according to claim 3, wherein said predetermined outputs are determined by, for each of said first outputs of said divider circuit, combining said cascaded gating means.

6. Divider device according to claim 3, wherein said cascade connection is dependent on said second polynomial.

7. Divider device according to claim 3, wherein said gating means are constituted by exclusive-OR logic circuits, said division being a modulo 2 division.

8. Divider device according to claim 1, wherein when the last bit of said second sequence of bits has a one value and n equals d, said divider circuit includes m gating means, m not exceeding n, each of which has an output coupled to a respective one of said outputs of said divider device via said addition means and said register means and each of which has a plurality of inputs each coupled to a predetermined one of said outputs of said divider device.

9. Divider device according to claim 8, wherein said predetermined outputs are determined by said second polynomial.

10. Divider device according to claim 8, wherein said predetermined outputs are determined by, for each of said first outputs of said divider circuit, combining said cascaded gating means.

11. Divider device according to claim 1, wherein said clock controlled register means (R) is controlled by a clock (CK) having a clock rate substantially equal to the arrival rate of the bits of said first sequence at said first inputs of said addition means (A), divided by n.

12. Divider device according to claim 1, wherein the structure of said divider circuit is derived from a theoretical realization of said steps of functionally dividing.

* * * * *

UNITED STATES PATENT AND TRADEMARK OFFICE
CERTIFICATE OF CORRECTION

PATENT NO. : 5,367,479
DATED : November 22, 1994
INVENTOR(S) : Van Der Putten

It is certified that error appears in the above-indentified patent and that said Letters Patent is hereby corrected as shown below:

Title page, item [75], inventor: change "oude Wichelsesteenweg" to-- Lede--.

item [57], Abstract: line 10, col. 2, change "17/IO" to-- I7/I0--.

Signed and Sealed this

Fourteenth Day of February, 1995

Attest:

BRUCE LEHMAN

Attesting Officer          Commissioner of Patents and Trademarks